US007436485B2

(12) United States Patent
Tel

(10) Patent No.: US 7,436,485 B2
(45) Date of Patent: Oct. 14, 2008

(54) LITHOGRAPHIC APPARATUS, PATTERNING ASSEMBLY AND CONTAMINATION ESTIMATION METHOD

(75) Inventor: Wim Tjibbo Tel, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/099,686

(22) Filed: Apr. 6, 2005

(65) Prior Publication Data

US 2006/0227307 A1 Oct. 12, 2006

(51) Int. Cl.
*G03B 27/42* (2006.01)
*G03B 27/52* (2006.01)

(52) U.S. Cl. .......................... 355/53; 355/30

(58) Field of Classification Search .......... 355/30, 355/52, 53, 55; 356/237, 237.2
See application file for complete search history.

(56) References Cited

U.S. PATENT DOCUMENTS

| | | | | |
|---|---|---|---|---|
| 4,766,324 A | * | 8/1988 | Saadat et al. ........... | 250/559.41 |
| 5,321,495 A | * | 6/1994 | Hagiwara et al. ........ | 356/237.3 |
| 5,710,624 A | * | 1/1998 | Utamura .................. | 356/237.5 |
| 5,870,189 A | * | 2/1999 | Uesugi et al. ............. | 356/335 |
| 5,898,182 A | * | 4/1999 | Toyama ................ | 250/559.41 |
| 6,365,425 B1 | * | 4/2002 | Ikota et al. .................... | 438/16 |

* cited by examiner

*Primary Examiner*—Hung Henry Nguyen
(74) *Attorney, Agent, or Firm*—Sterne, Kessler, Goldstein & Fox P.L.L.C.

(57) ABSTRACT

A lithographic apparatus includes a pattern support to support a patterning device, the patterning device to impart a radiation beam with a pattern in its cross-section to form a patterned radiation beam. The lithographic apparatus further includes a position measurement system to perform a position measurement of a reference mark of the patterning device. Also, the lithographic apparatus includes a contamination monitor to estimate a contamination of at least one of the patterning device and the pattern support by performing first and second position measurements of at least one reference mark of the patterning device and estimating a contamination from a position difference between the first and second position measurements.

20 Claims, 3 Drawing Sheets

LITHOGRAPHIC APPARATUS, PATTERNING ASSEMBLY AND CONTAMINATION ESTIMATION METHOD

BACKGROUND

1. Field of the Invention

The present invention relates to a lithographic apparatus, a patterning assembly and a contamination estimation method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus includes a patterning device configured to impart a radiation beam with the pattern in its cross-section to form the patterned radiation beam. The patterning device is supported by a pattern support making the patterning device exchangeable, thus making it possible to obtain a variety of patterns by exchange of the patterning device. The lithographic apparatus commonly operates in a clean environment, i.e. an environment in which contamination, dust, or any other type of pollution has been reduced to a minimum. Nevertheless, some degree of contamination on the patterning device or on the pattern support is observed. Such contamination may include any type of particles, and may be in an order of magnitude of a nanometer range to micrometer range in thickness thereof. A consequence of this contamination is a deformation of a shape of the patterning device leading to positional inaccuracies (X/Y) and/or focus loss (Z) during exposure. A further adverse effect of such contamination is that it may result in slippage of the patterning device with respect to the pattern support when moving the pattern support. The lithographic apparatus frequently make use of a patterning device which performs a scanning movement, thus the patterning device and pattern support being subjected to acceleration and deceleration forces. As these forces act on the pattern support (actuators to move the patterning device and pattern support act on the pattern support), slippage of the patterning device with respect to the pattern support may occur. In addition, the patterning may be held onto the pattern support using a vacuum suction device. A contamination may thus result in a reduction of an effective force with which the patterning device is held by the pattern support.

SUMMARY

It is desirable to estimate a contamination of the patterning device and/or the pattern support. According to an embodiment of the invention, there is provided a lithographic apparatus including a pattern support configured to support a patterning device, the patterning device being configured to impart a radiation beam with a pattern in its cross-section to form a patterned radiation beam; a position measurement system to perform a first and a second position measurement of a position of at least one reference mark of the patterning device; and a contamination monitor to estimate a contamination of at least one of the patterning device and the pattern support, the contamination monitor to estimate the contamination from a position difference between the first and second position measurements.

In another embodiment of the invention, there is provided a patterning assembly for an optical projection apparatus, the patterning assembly including a pattern support configured to support a patterning device, the patterning device being configured to impart a radiation beam with a pattern in its cross-section to form a patterned radiation beam; a position measurement system to perform a first and a second position measurement of at least one reference mark of the patterning device; and a contamination monitor to estimate a contamination of at least one of the patterning device and the pattern support, the contamination monitor to estimate the contamination from a position difference between the first and second position measurements.

According to a further embodiment of the invention, there is provided a method to estimate a contamination of at least one of a patterning device and a pattern support, the pattern support configured to support the patterning device, the patterning device being configured to impart the beam of radiation with a pattern in its cross-section to form a patterned radiation beam; the method including: performing a first and a second position measurement of at least one reference mark of the patterning device; and estimating the contamination from a position difference between the first and second position measurements.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
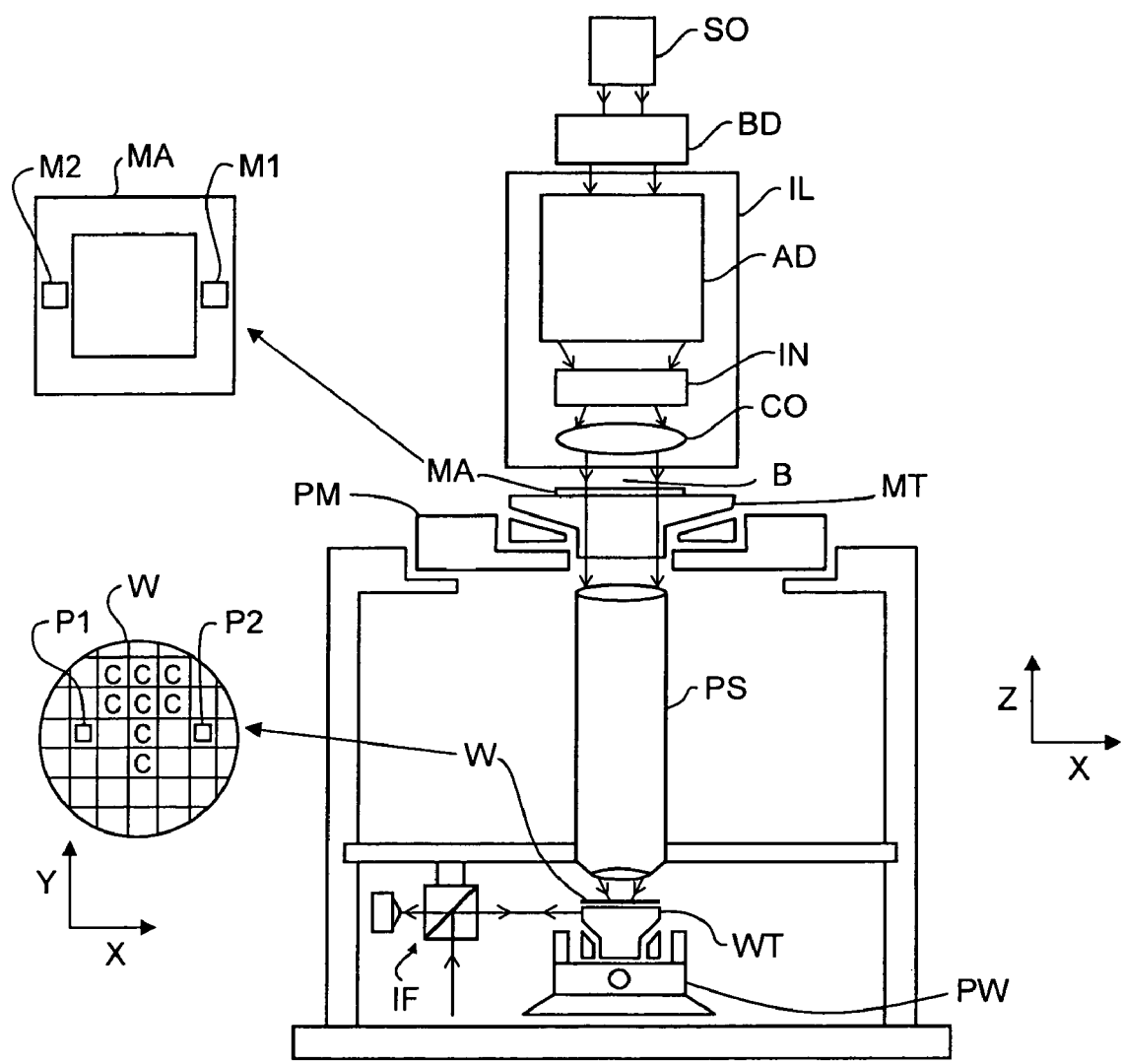
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT or "mask support" and the substrate table WT or "substrate support" are kept essentially stationary, while an entire pattern imparted to the radiation beam is projected onto a target portion C at once (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

Scan mode: the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
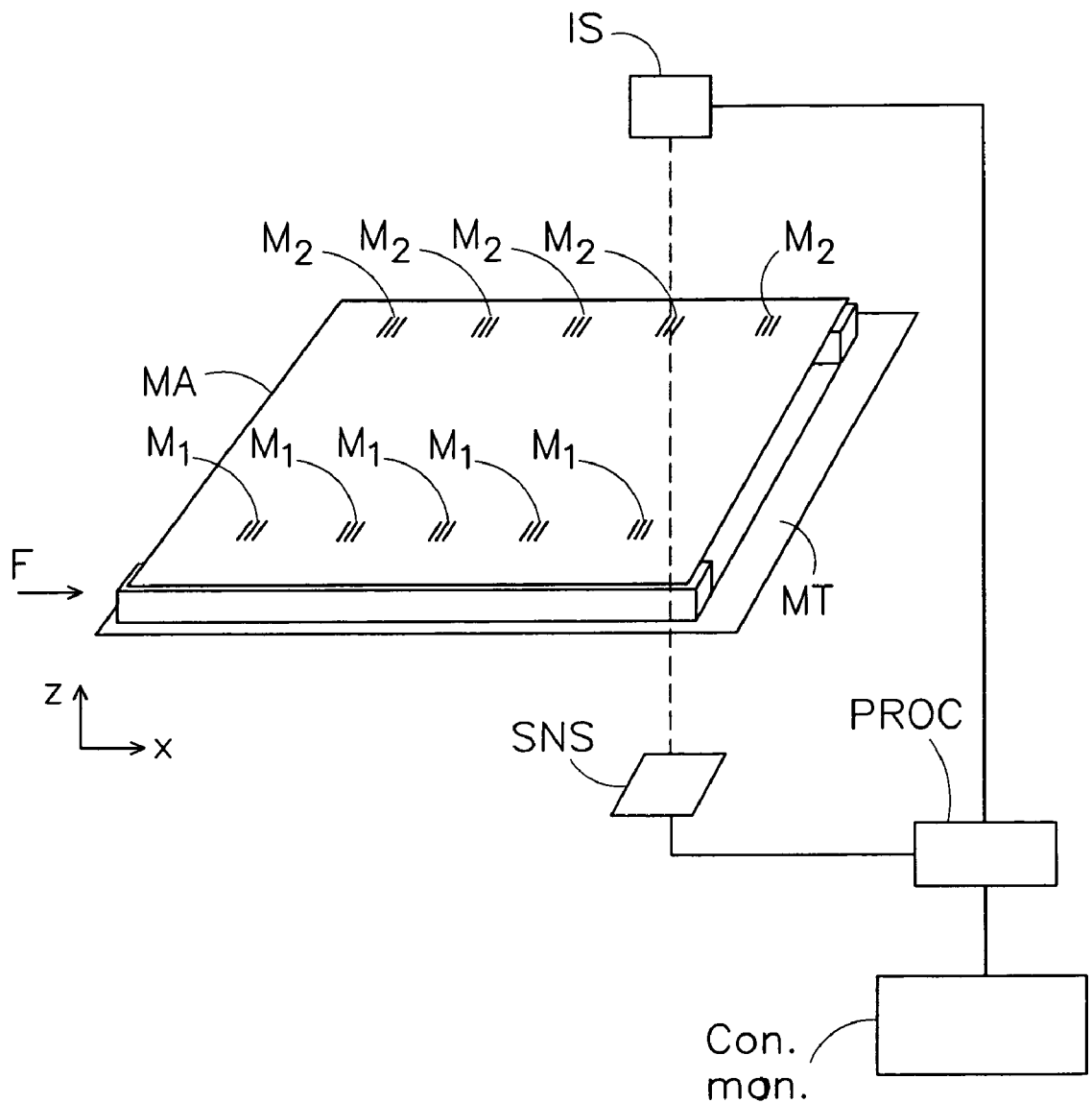
FIG. 2 depicts a schematic view of a patterning device, position measurement system and contamination monitor of a lithographic apparatus according to an embodiment of the invention.

FIG. 2 depicts a patterning device MA held by a patterning support MT, a part of which is shown in FIG. 2. The patterning device MA includes a plurality of alignment marks M1 and M2, which may also be indicated as reference marks. FIG. 2 further shows a position measurement system including, e.g., an illumination source IS, a sensor SNS and a processing device PROC. The illumination source IS under control of the processing device PROC sends a beam of illumination to one of the reference marks (in the position shown in FIG. 2 one of the reference marks M2), which results in a beam being detected by the sensor SNS. The reference marks M1, M2 may include a grating, resulting in an interference pattern (or part thereof) to be detected by the sensor SNS. An example of a position measurement system including the illumination source IS, reference marks M1, M2 and sensor SNS that may be used in an embodiment of the invention may be found in EP 1 510 870 A1, which is included herein by reference. The processing device PROC processes sensor data, possibly in combination with any other data such as position data representing a position of the patterning device, patterning support etc. and is adapted to calculate a position from the data obtained. The processing device may include any type of device configured to process data, such as electronic processing device including, e.g., a microprocessor, microcontroller, or any other programmable device which is programmed with suitable software instructions. FIG. 2 further shows a contamination monitor (illustrated as "CON. MON." in FIG. 2 which may also include a data processing device such as an electronic processing device of a type described above with reference to the processing device PROC. Further, the contamination monitor may be adapted to drive the position measurement system to perform a position measurement. The contamination monitor and the processing device of the position measurement may include separate processing devices, however it is also possible that the functions of both these devices be implemented in suitable software in a single data processing device.

A contamination is estimated by performing a first position measurement providing a position of at least one reference mark of the patterning device, performing a second position measurement providing at least one position of a reference mark of the patterning device and by calculating a position difference between the first and second position measurements. In case no contamination is present, while the patterning device MA has been correctly positioned with reference to the patterning support MT, identical positions will be detected for the or each reference mark when performing the first and the second position measurements. In case, however, a difference in position is detected between the first and second position measurements, this position difference observed at one or more reference marks M1, M2 is indicative of a contamination on a part of the pattern support MT which is in contact with the patterning device MA positioned thereon, and/or on the patterning device MA itself at a part of a zone of the patterning device which, when positioned on the patterning support, is in contact therewith. In current implementations, contamination may be found in a range of several nanometers (e.g. tens to hundreds of nanometers) and larger. Therefor, position differences of the patterning device between first and second measurements may result, which show a difference in a position in a plane perpendicular to the patterning device MA, thus in a z-direction as shown in FIG. 2. The first and second position measurement may be performed with a time interval, position measurements relating to a same reference mark, thus providing an indication of a built up of contamination in this time interval. Also, it is possible to perform a plurality of second position measurements, the position difference ends including a position drift. A benefit is that fluctuations or other causes, which may result in position inaccuracies, may be averaged out thus increasing a reliability of the contamination estimation.

The lithographic apparatus may be adapted to exercise a disturbance force (indicated by F in FIG. 2) on the patterning device between the first and second position measurements. In case a contamination is present on the patterning device MA and/or the pattern support MT, the disturbance force which results in an acceleration of the pattern support MT, may lead to some degree of slippage of the patterning device MA with respect to the pattern support MT. Such slippage thus translates into a position difference, in the embodiment shown in FIG. 2 a position difference most likely in a direction of scanning. However, if slippage occurs at one side only, a position difference in a plane parallel to the patterning device may occur. Thus, an amount of displacement in this manner provides an estimation for an amount of contamination. Further, it is possible that the lithographic apparatus is adapted to reduce a holding force with which the patterning device is held by the pattern support, the holding force being reduced when the disturbance force is exercised. In a common implementation, the holding force may be generated by a vacuum, the patterning device MA thus being held to the pattern support MT by a vacuum suction. By reducing a vacuum, a holding force is reduced. In this manner, a lower level of contamination may be detected, as in case of a low level of contamination, slippage may occur at a moment when the holding force is reduced, and a position difference (e.g. in an x-direction) of the reference mark between first and second measurements at a reduced holding force may thus provide indication for an amount of contamination which is not high enough to cause any slippage when the holding force is at its nominal, operational value, while already providing some degree of slippage at a reduced holding force. In an embodiment, a plurality of second measurement are performed and the holding force is reduced step by step each time the disturbance force is exercised. It is possible to reduce step by step the holding force before each exercising of the disturbance force, until a position difference of a reference mark reaches a predetermined level. A level of contamination may hence be estimated from a value of the disturbance force at which slippage, thus displacement of the patterning device, starts to occur in combination with the amount of slippage of observed, thus the position difference observed.

Also, without exerting the disturbance force and measuring deviations in shape of the patterning device at a reduced holding force accurate measurements are possible. Contaminants can then be detected which do not show up at the nominal holding force because of, e.g. squeezing, but which may already show up at the reduced holding force, because then less or no squeezing might occur, which may result in a position difference of a reference mark as compared to a position thereof at a previous measurement, preferably at the same reduced holding force.

It is noted that the wording "reduce a holding force when performing the position measurement" is to be understood as reducing the holding force, i.e. applying a reduced holding force before performing the position measurement and keeping the holding force at the reduced value during the respective position measurement.

Figure 3:
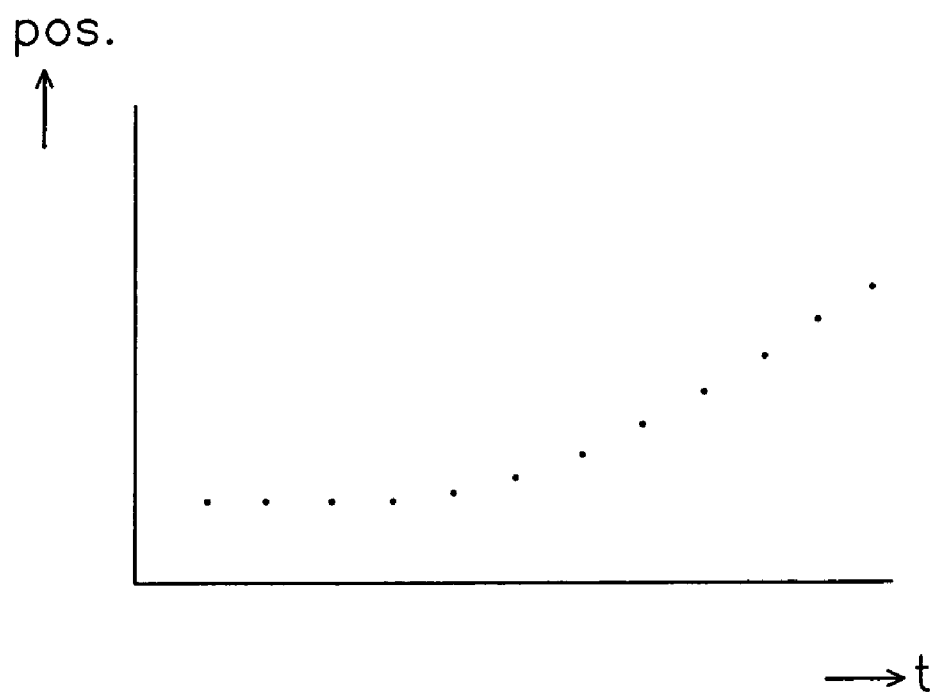
FIG. 3 depicts a graphical representation of a position drift as a function of time in a lithographic apparatus according to an embodiment of the invention.

FIG. 3 shows a graph of a position of the single reference mark at a plurality of moments in time. It is noted that after a certain amount number of position measurements, a position drift is observed, which is indicative of a built up of contamination between the patterning device MA and the pattern support MT. The position measurements thus include a first position measurement (an initial position measurement) and a plurality of second position measurements relating to a same reference mark.

Figure 4:
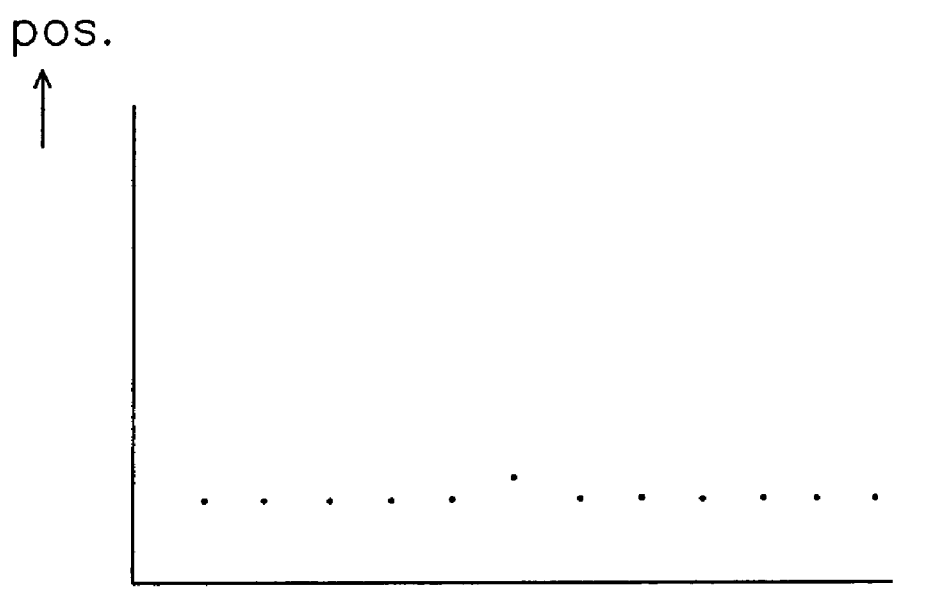
FIG. 4 depicts position measurement results of a plurality of reference marks in a lithographic apparatus according to an embodiment of the invention.

FIG. 4 depicts a plurality of position differences between $2^{nd}$ and $1^{st}$ measurements for a plurality of reference marks. For one of the reference marks, it is observed that its position difference deviates from the other reference marks. In this example, the positions each include a position in a direction perpendicular to a plane of the patterning device MA. From the measurement data as obtained in FIG. 4, it can be concluded that a contamination might be present near the sixth mark, as the position difference of the sixth mark deviates from the other position difference. Also, it is possible to combine the measurement methods as depicted in FIG. 3 and FIG. 4, and a drift may be determined for a plurality of position marks, while a relatively stronger drift of one or more of the reference marks compared with others of the reference marks is indicative of a stronger contamination near these reference marks.

The reference marks which are applied for estimating the contamination may be located near a clamping area of the pattern support, thus near the area of the patterning device MA where it is in contact with the pattern support MT and where the holding force to hold the patterning device MA onto the pattern support MT is exercised. This results in a more accurate estimation of contamination, as in such an embodiment the reference mark is relatively close to the clamping area.

In a further embodiment, it is possible to program the contamination monitor to generate a recalibration message to recalibrate a flatness or shape of the patterning device when the position difference between the first and second measurements exceeds a predetermined position difference level. In an embodiment, the patterning device of the lithographic apparatus is calibrated, so as to enable to lithographic apparatus to correct for a flatness (shape) of the patterning device. By generating a recalibration message, a recalibration may take place to thus prevent that differences in the position of the reference marks, and thus differences in the position of parts of the surface of the patterning device, may result inaccuracies or projection errors. In an embodiment, the reference marks used for the position measurements in the contamination estimation according to the invention are used for calibration of a flatness of the patterning device.

Further, it is possible to program the contamination monitor to generate a cleaning message to clean at least one of the patterning device and the pattern support when the contamination estimated from the position difference exceeds a predetermined level. The cleaning may be performed manually. However, it is also possible to implement an automatic cleaning in the lithographic apparatus, the cleaning message thus initiating a cleaning by such automatic cleaning mechanism. The cleaning message may include a pattern support cleaning message to clean the pattern support and/or a patterning device cleaning message to clean the patterning device. The first may be generated when a position difference exceeding the predetermined level has been detected for an amount of patterning devices, thus, e.g., a predetermined number of patterning devices or a percentage of a total number of patterning devices applied. Also, it is possible to generate the pattern support cleaning message when a certain amount of correlation in position difference has been found for a plurality of patterning device applied. The patterning device cleaning message may be generated when a position difference exceeding a predetermined level has been detected for a single patterning device only. Thus, when position differences have been detected for a single or a small amount of patterning devices out of a total amount of patterning devices applied, it is most likely that the patterning device in question is contaminated, thus resulting in a cleaning message therefore while in case that a high degree of correlation between position differences for a plurality, such as a majority of patterning devices is observed, it is most likely that the pattern support shows some degree of contamination, thus requiring some cleaning.

The contamination estimation as described above is not only applicable to a lithographic projection apparatus, but may be applied in any patterning assembly for an optical projection apparatus. The above description is thus applicable to such patterning assembly as well.

The method according to an embodiment of the invention will now be described with reference to FIG. 2. According to an embodiment, a contamination of at least one of the patterning device MA and the pattern support MT is estimated, the method includes performing a first position measurement of at least one reference mark M1, M2 of the patterning device MA, performing a second position measurement of at least one reference mark M1, M2 of the patterning device MA and estimating the contamination from the position difference between the first and second position measurements.

All embodiments and examples as described with reference to the lithographic apparatus according to the invention are also applicable—mutatis mutandis—to the patterning assembly and contamination estimation method according to the invention.

By estimating the contamination as described above, a build up of contamination which may result in a slippage of the patterning device MA with respect to the mask table MT may be prevented, as appropriate actions such as a cleaning of the one or both of the patterning device and the pattern support may be initiated before an amount of contamination occurs which may lead to such slippage. Further, position inaccuracies of the patterning device MA as a result of a contamination of the patterning device MA and/or the pattern support MT may be prevented, as at a moment when a certain amount of contamination is detected, i.e. a certain amount of position deviation is detected, appropriate actions can be taken such as a cleaning of one or both of the patterning device and the pattern support or a recalibration of the position (e.g. a recalibration of a flatness or shape of the patterning device MA.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
a pattern support configured to support a patterning device, the patterning device being configured to impart a radiation beam with a pattern in its cross-section to form a patterned radiation beam;
a position measurement system configured to perform a first and a second position measurement of a position of a reference mark of the patterning device; and
a contamination monitor configured to estimate a contamination of the patterning device, or the pattern support, or both the patterning device and the pattern support, from a position difference between the first and second position measurements, the first and second position measurements being performed at different times.

2. The lithographic apparatus according to claim 1, wherein the first position measurement and the second position measurement relate to a same reference mark.

3. The lithographic apparatus according to claim 2, wherein the pattern support is adapted to reduce a holding force with which the patterning device is held by the pattern support when performing the first and second position measurements.

4. The lithographic apparatus according to claim 2, wherein the lithographic apparatus is adapted to exert a disturbance force on the patterning device between the first and second position measurements.

5. The lithographic apparatus according to claim 4, wherein the pattern support is adapted to reduce the holding force when the disturbance force is exerted on the patterning device.

6. The lithographic apparatus according to claim 5, wherein the contamination monitor is adapted to perform a plurality of second measurements, and wherein the lithographic apparatus is adapted to exert the disturbance force between each of the second position measurements and to reduce the holding force before exerting the disturbance force.

7. The lithographic apparatus according to claim 2, wherein the contamination monitor is adapted to perform a plurality of second position measurements, the position difference comprising a position drift.

8. The lithographic apparatus according to claim 1, wherein the contamination monitor is adapted to perform the first and second position measurements for a plurality of reference marks, a change in position of a reference mark as compared to a change in position of neighboring reference marks providing an indication on a position of a contamination spot.

9. The lithographic apparatus according to claim 1, wherein the first and second position measurement comprise a measurement of the position of the reference mark in a direction substantially perpendicular to a plane of the patterning device.

10. The lithographic apparatus according to claim 1, wherein the first and second position measurement comprise a measurement of the position of the reference mark in a direction substantially parallel to a plane of the patterning device.

11. The lithographic apparatus according to claim 1, wherein the reference mark comprises a reference mark near a clamping area of the pattern support.

12. The lithographic apparatus according to claim 1, wherein the contamination monitor is programmed to generate a re-calibration message to re-calibrate a shape of the patterning device when the position difference between the first and the second measurement exceeds a predetermined position difference level.

13. The lithographic apparatus according to claim 1, wherein the contamination monitor is programmed to generate a cleaning message to clean the patterning device, or the pattern support, or both the patterning device and the pattern support, when the contamination estimated from the position difference exceeds a predetermined level.

14. The lithographic apparatus according to claim 13, wherein the contamination monitor is configured to generate a pattern support cleaning message to clean the pattern support when a position difference exceeding the predetermined level has been detected for a predetermined amount of patterning devices.

15. The lithographic apparatus according to claim 13, wherein the contamination monitor is configured to generate a patterning device cleaning message to clean the patterning device when a position difference exceeding the predetermined level has been detected for a single patterning device.

16. The lithographic apparatus according to claim 1, wherein the position measurement comprises an optical position measurement.

17. The lithographic apparatus according to claim 16, wherein the reference mark comprises a grating.

18. A patterning assembly for use in an optical projection apparatus, the patterning assembly comprising:
   a pattern support configured to support a patterning device, the patterning device being configured to impart a radiation beam with a pattern in its cross-section to form a patterned radiation beam;
   a position measurement system to perform a first and a second position measurement of a reference mark of the patterning device; and
   a contamination monitor to estimate a contamination of the patterning devices or the pattern support, or both the patterning device and the pattern support, from a position difference between the first and second position measurements, the first and second position measurements being performed at different times.

19. A method of estimating a contamination of the patterning device, or the pattern support, or both the patterning device and the pattern support, the pattern support configured to support the patterning device, the patterning device being configured to impart the beam of radiation with a pattern in its cross-section to form a patterned radiation beam, the method comprising:
   performing a first and a second position measurement of a reference mark of the patterning device at different times; and
   estimating the contamination from a position difference between the first and second position measurements.

20. The lithographic apparatus according to claim 1, comprising a substrate table configured to support a substrate and a projection system configured to project the patterned radiation beam onto a surface of the substrate.

* * * * *